US010873339B1

(12) United States Patent
Chao

(10) Patent No.: US 10,873,339 B1
(45) Date of Patent: Dec. 22, 2020

(54) ON-CHIP PATTERN GENERATOR FOR HIGH SPEED DIGITAL-TO-ANALOG CONVERTER

(71) Applicant: Yuan-Ju Chao, Cupertino, CA (US)

(72) Inventor: Yuan-Ju Chao, Cupertino, CA (US)

(73) Assignee: IPGREAT INCORPORATED, Grand Cayman (KY)

( * ) Notice: Subject to any disclaimer, the term of this patent is extended or adjusted under 35 U.S.C. 154(b) by 0 days.

(21) Appl. No.: 16/726,788

(22) Filed: Dec. 24, 2019

(51) Int. Cl.
H03M 1/10 (2006.01)
(52) U.S. Cl.
CPC .................. H03M 1/1071 (2013.01)
(58) Field of Classification Search
CPC .................................................. H03M 1/1071
USPC .................. 341/144, 120, 100, 101
See application file for complete search history.

(56) References Cited

U.S. PATENT DOCUMENTS

| 4,382,285 | A | * | 5/1983 | Sumner | H03H 15/00 708/301 |
| 7,683,842 | B1 | * | 3/2010 | Engel | H04K 3/822 343/703 |
| 8,717,274 | B2 | * | 5/2014 | Lin | G09G 3/20 345/99 |
| 9,439,625 | B2 | * | 9/2016 | Cogan | A61B 8/4444 |
| 2002/0021646 | A1 | * | 2/2002 | Redman-White | H03M 13/3961 369/59.22 |
| 2005/0097944 | A1 | * | 5/2005 | Hare | G01Q 70/06 73/105 |
| 2014/0160172 | A1 | * | 6/2014 | Lee | G09G 3/2003 345/690 |

* cited by examiner

Primary Examiner — Peguy Jean Pierre
(74) Attorney, Agent, or Firm — Patent Law Office PC; Bao Tran

(57) ABSTRACT

A method of enabling full speed test and characterization for high-speed Digital-to-Analog Converter (DAC) by employing an on-chip pattern generator. The test pattern is written to the on-chip pattern generator through a low data rate Integrated circuit (IC) interface, and the pattern generator is then enabled and coupled to DAC to facilitate full speed test for DAC. This method does not require extra input/output pin or extra process and minimize design complexity.

19 Claims, 8 Drawing Sheets ional order. It is to be understood that the terms so used are interchangeable under appropriate circumstances and that the embodiments of the invention described herein are capable of operation in other sequences than described or illustrated herein.

ON-CHIP PATTERN GENERATOR FOR HIGH SPEED DIGITAL-TO-ANALOG CONVERTER

BACKGROUND

FIG. 1 shows the measurement setup of high-speed digital-to-analog converter (DAC). An arbitrary waveform generator (AWG) is used to deliver test data into an Integrated Circuit (IC) DAC device. The output of DAC is connected to spectrum analyzer for performance analysis. The clock input of DAC and arbitrary waveform generator (AWG) arises from the same clock source to ensure the timing synchronization between clock and test data. The speed bottleneck for this measurement setup is the Integrated Circuit I/O (input/output) interface. The most advanced arbitrary waveform generator (AWG) can provide multi-giga Hertz data rate but the Integrated Circuit (IC) interface is usually limited to one-giga Hertz data rate even for the most advanced Integrated Circuit (IC) technology such as 16 nm FinFET. For high-speed multi-giga sampling rate DAC, such setup is not capable to test the full conversation rate of DAC.

A method of incorporating on-chip pattern generator with DAC is presented to enable DAC characterization at its full data rate. FIG. 2 shows the proposed high-speed DAC block diagram with employment of on-chip pattern generator. The pattern generator 202 and input Multiplexer (MUX) 203 are inserted between existing IC interface 201 and DAC circuitry 204. Input multiplexer 203 controls the DAC input either comes from on-chip pattern generator or external AWG. The pattern generator clock is coupled to DAC clock. The pattern generator comprising a series of D flip-flops which coupled to DAC and provide input test date at full conversion rate. The pattern data is written through low speed IC interface such as SPI (Serial Peripheral Interface) or I2C (Inter-Integrated Circuit). Once the specific pattern data is written into the D flip-flops, pattern generator is then enabled to deliver input date into DAC circuit at DAC's maximum data rate. The data rate from pattern generator to DAC can be as high as DAC operates since it doesn't go through IC I/O (input/output) interface and is physically placed right next to DAC. This proposed configuration does not require any extra input or output pin. By employing on-chip pattern generator, DAC can be tested and characterized at its full speed without data rate being compromised and limited by the IC I/O.

SUMMARY

An on-chip pattern generator, comprising a series of D flip-flops to serve input data for a high-speed Digital-Analog Converter (DAC). Data patterns are written into D flip-flops through a low speed interface such as an SPI (Serial Peripheral Interface) or an I2C (Inter-Integrated Circuit) interface. The data pattern is enabled to provide input data at the full speed of DAC. There is no extra pin required by incorporating this pattern generator into the DAC circuitry. The pattern generator can run at very high data rate and is compact in size. The on-chip pattern generator enables high-speed data input into DAC, which is not achievable using conventional test method.

In another aspect, a method of incorporating on-chip pattern generator to perform high speed input into DAC circuitry.

A more complete appreciation of the present invention and its improvements can be obtained by reference to the accompanying drawings, which are briefly summarized below, to the following detailed description of illustrative embodiment of the invention, and to the appended claims.

DETAILED DESCRIPTION

Figure 1:
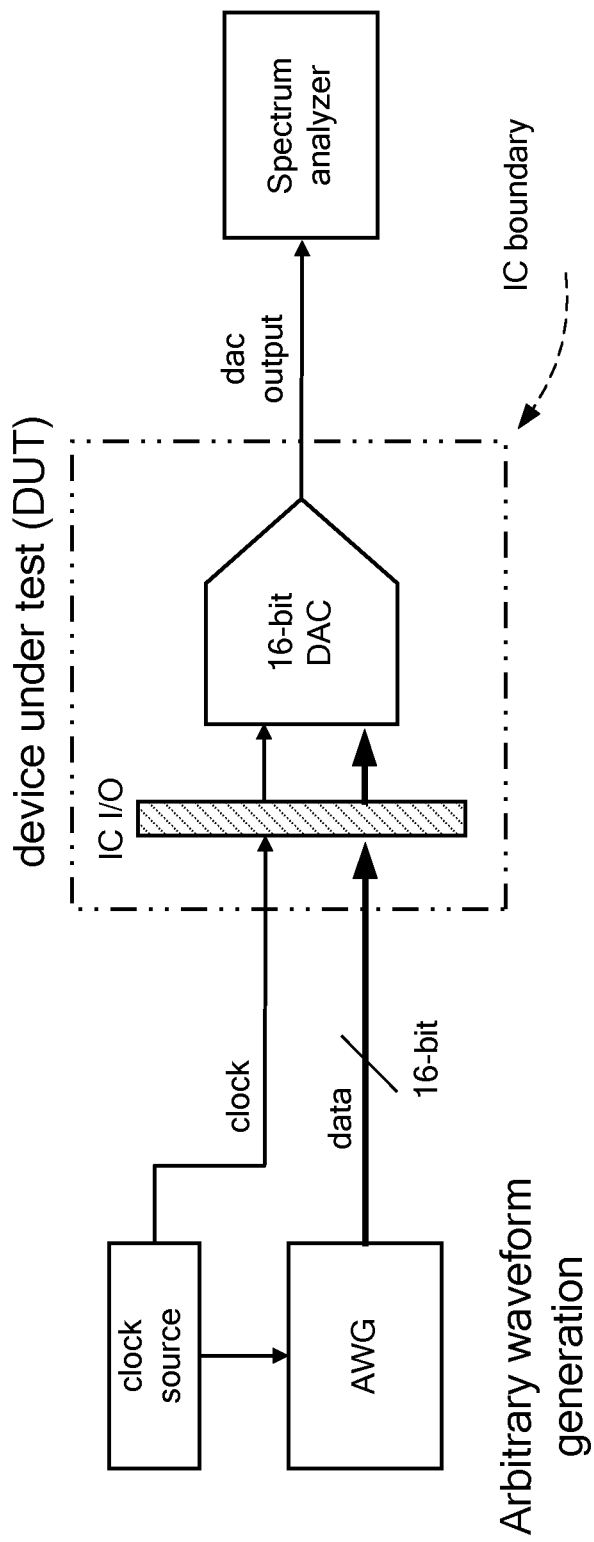
FIG. 1 illustrates the measurement setup of DAC testing.
Figure 2:
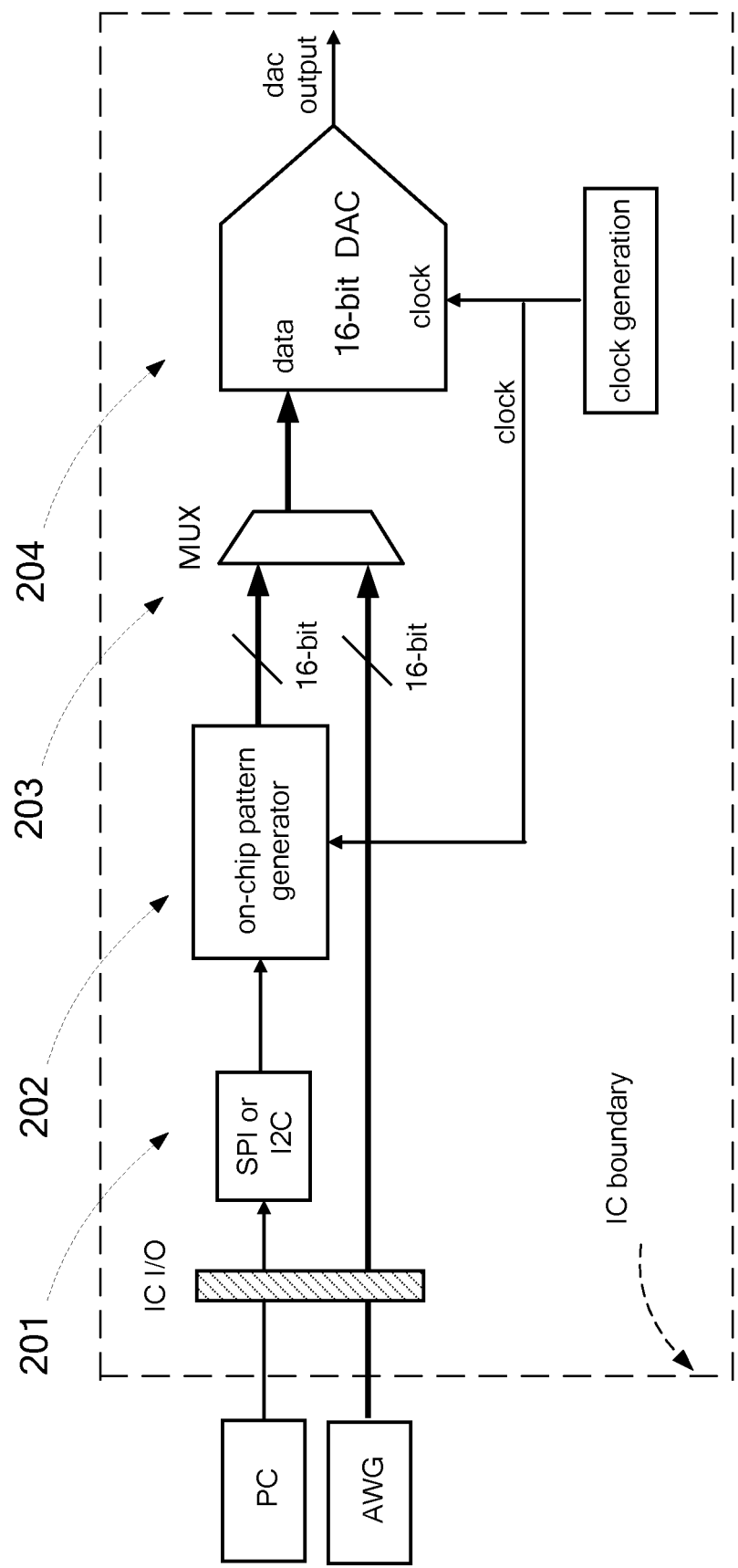
FIG. 2 shows the high speed DAC diagram with on-chip pattern generator.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

The terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Furthermore, it is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Similarly, it is to be noticed that the term "coupled" discloses both direct and indirect coupling and should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

Figure 3:
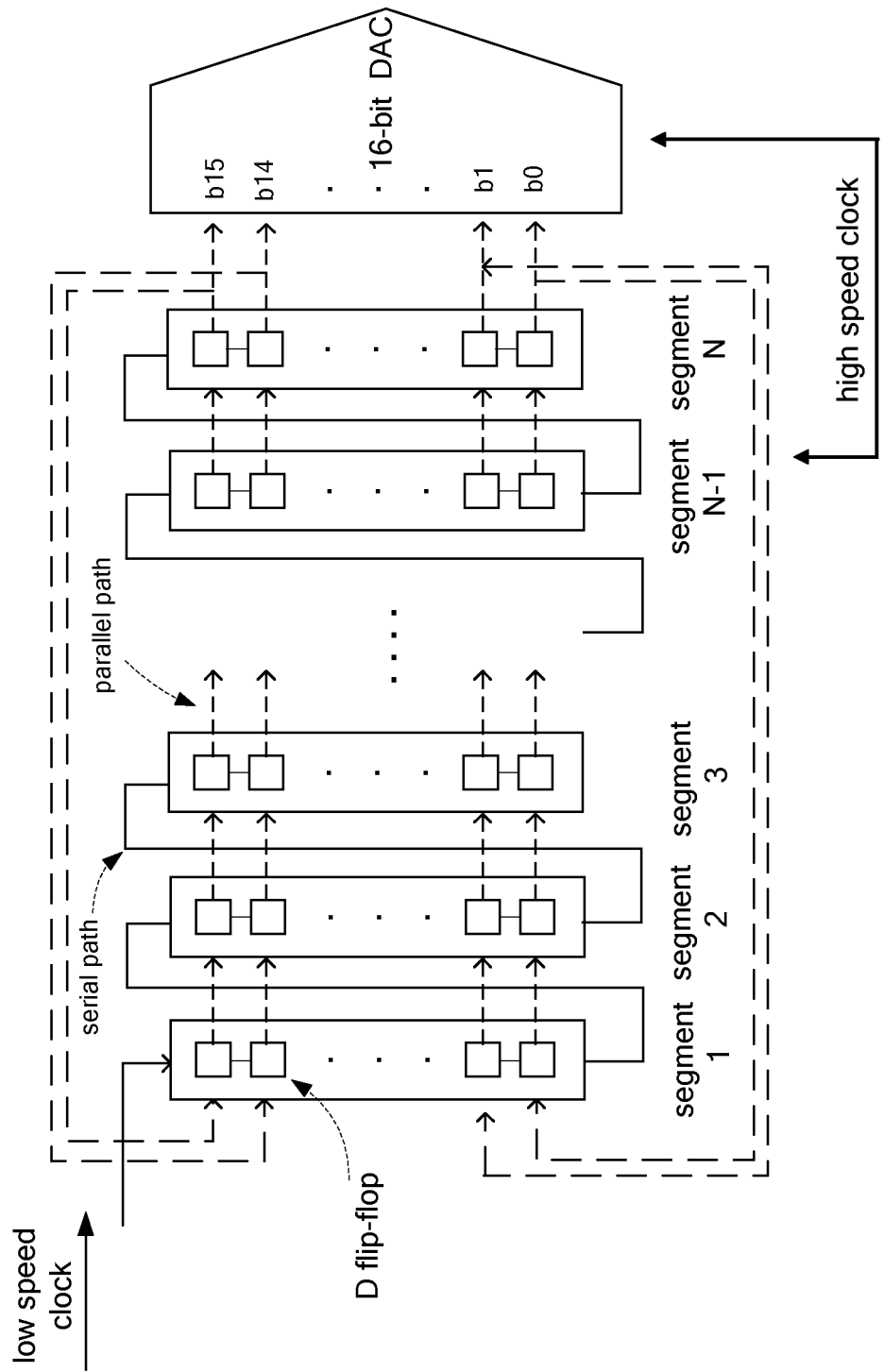
FIG. 3 shows the exemplary on-chip pattern generator for a 16-bit DAC.

FIG. 3 illustrates the exemplary on-chip pattern generator for 16-bit DAC. It comprises N flip-flop segments. Each segment consists of 16 D flip-flops in series. The number of D flip-flop in each segment equals the resolution of DAC. There are two connection configurations co-existed in the pattern generator. For the serial configuration, the end of each segment is coupled to the beginning of the next segment. The serial configuration starts at the beginning of the first segment and finishes at the end of the last segment. The end of the last segment does not connect to other segments. This signal path of serial configuration is illustrated in solid line. It goes from the first segment and proceeds all the way till the end of the last segment. For the serial signal path, it travels and goes through total 16×N flip-flop for the whole on-chip generator.

For the parallel configuration, each segment is coupled to the adjacent segment in parallel format. The last segment outputs are coupled back to the inputs of the first segments forming a closed loop. All N segments are in circular connection configuration. The signal path only travels from segment to the next segment, it doesn't travel inside the segment. The signal path of parallel configuration is illustrated in dotted line. For the parallel configuration, it takes N cycles to complete the loop and goes back to the beginning of the loop since there are N segments. The number N is the specified length of the desired test pattern. These two configurations co-exist in the on-chip pattern generator and serve different functionality. A register control signal is used to determine which configuration is employed.

Figure 4:
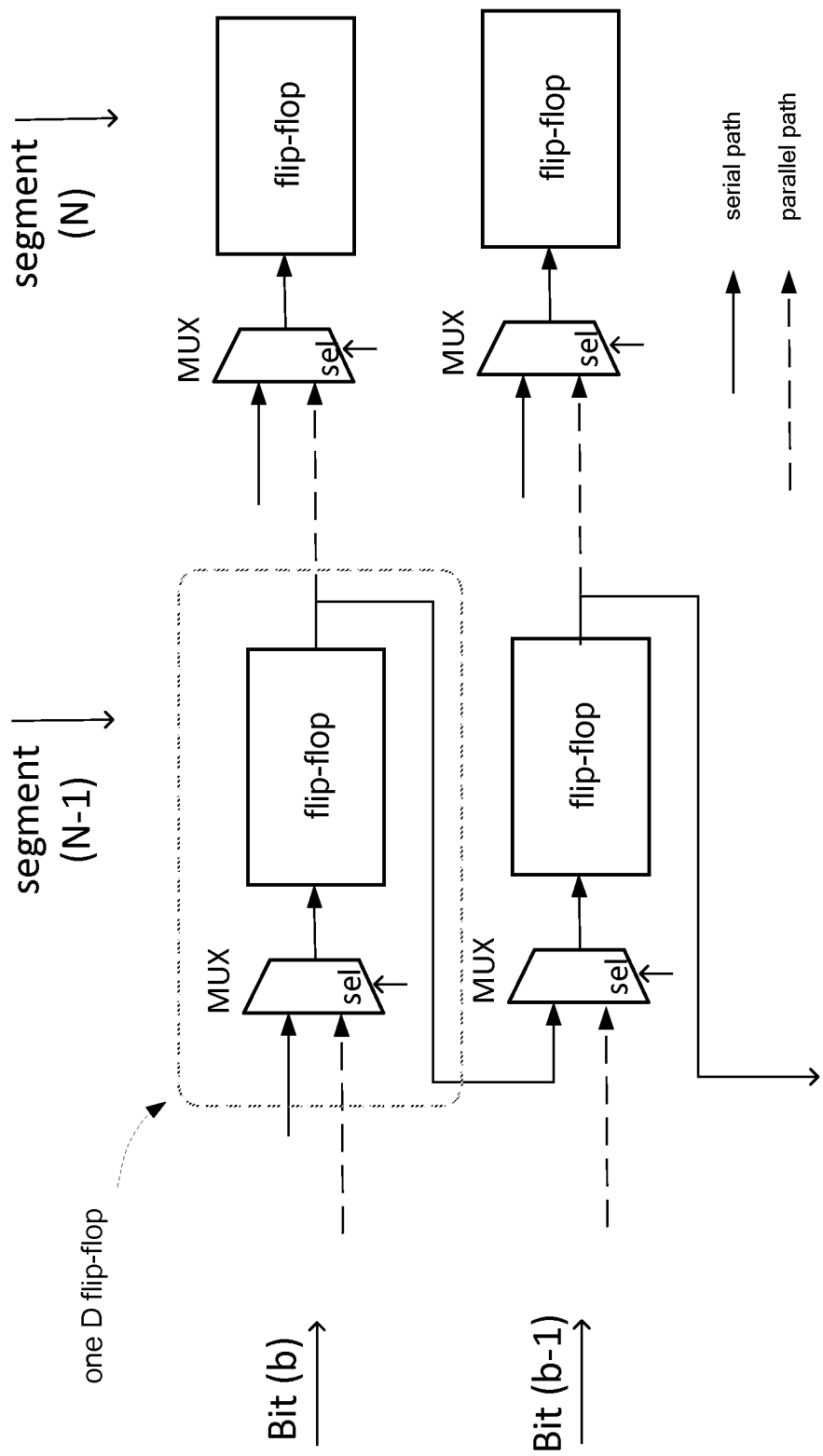
FIG. 4 is the implementation of D flip-flop in on-chip pattern generator.

FIG. 4 shows the structure of pattern generator D flip-flop. It comprises a flip-flop with two-to-one input multiplexer (MUX). Four D flip-flops out of two adjacent segments are shown to illustrate the serial and parallel signal connection. The MUX select pin (sel) controls the input of D flip-flop is either from serial path or parallel path. This select pin also selects the clock of pattern generator, the low speed clock is used for serial signal path and the high-speed clock is used for parallel signal path. The flip-flop output is coupled to both serial path and parallel path. Flip-flops can be employed in serial format with signal path shown in solid line or can be utilized in parallel format with signal path shown in dotted line. The implementation of the flip-flop is a conventional digital flip-flop circuitry, no special technology process or extra manufacture layer or mask required during Integrated circuit (IC) process. This implementation avoids the extra cost and minimizes the design complexity. Conversely, pattern generator using memory such as Static random-access memory (SRAM) requires special process, extra mask layer and necessitates memory compiler for implementation, which increases design complexity.

Figure 5:
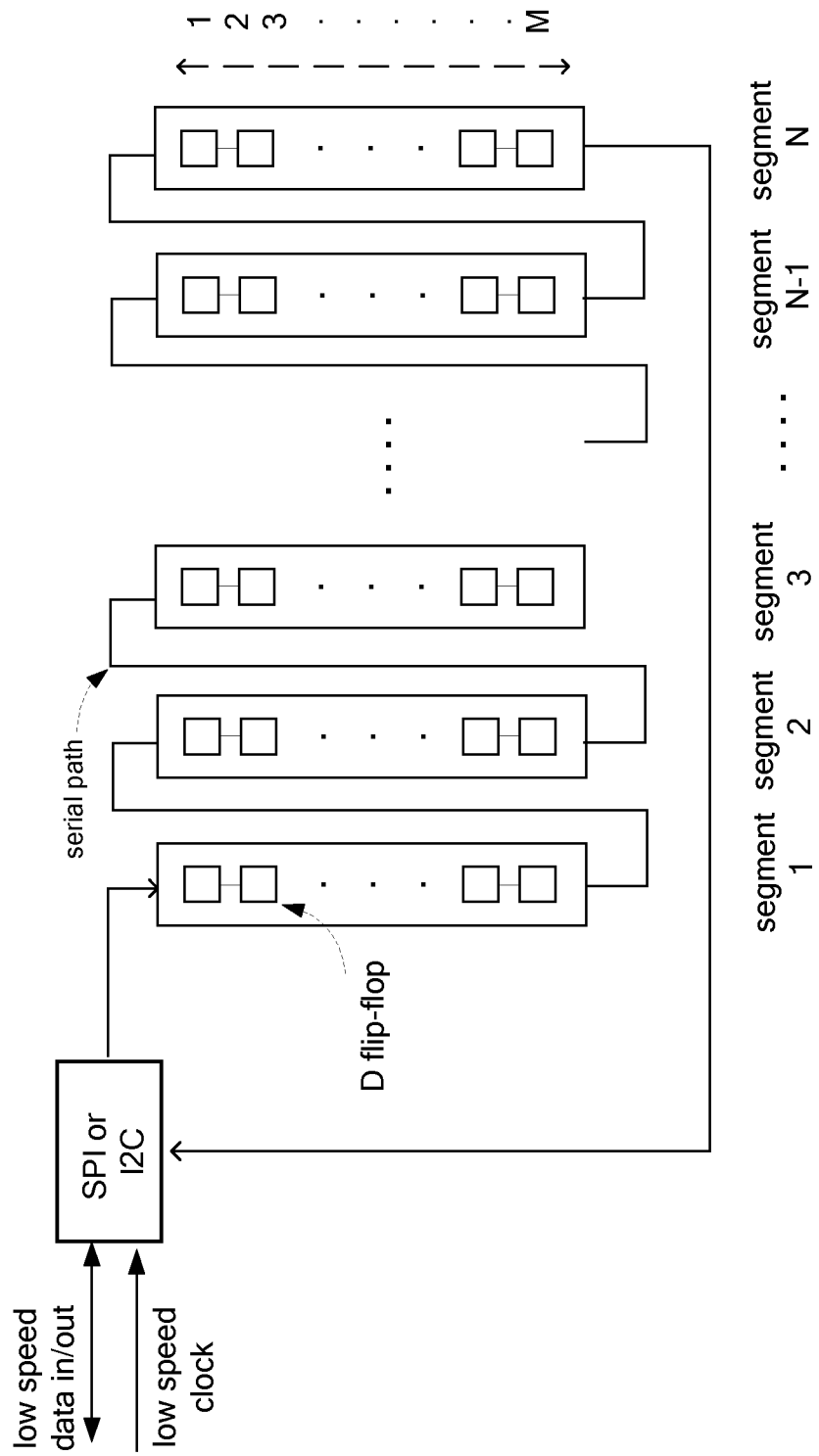
FIG. 5 illustrates the pattern generator signal path employed in pattern-write mode.

There exist two operation modes for on-chip pattern generator: pattern-write mode and pattern-read mode. These two modes correspond to the serial and parallel configuration of the pattern generator respectively. The pattern-write mode needs to be executed before pattern-read mode is executed. FIG. 5 illustrates the on-chip pattern generator employed in pattern-write mode. The input pattern data is written through IC interface such as SPI (Serial Peripheral Interface) or I2C (Inter-Integrated Circuit). The IC interface output is coupled to the beginning of the first segment. There are M D flip-flop coupled in serial inside each segment. M is the resolution number of DAC. The end of each segment is connected to the beginning of the next segment. Each segment is coupled to the next segment in serial format and the last segment output is coupled back to IC interface which can be read out for debug purpose.

The specified test pattern is written into on-chip pattern generator with low data rate IC interface. It takes M×N clock cycles to finish the pattern write since there are total M×N D flip-flops. This proposed method does not add extra IC input/output since IC interface either SPI (Serial Peripheral Interface) or I2C (Inter-Integrated Circuit) is an existing IC communication interface. Besides, the test pattern can be programmed and modified as needed compared with fixed on-chip pattern generator, which can't be altered any more once written.

Figure 6:
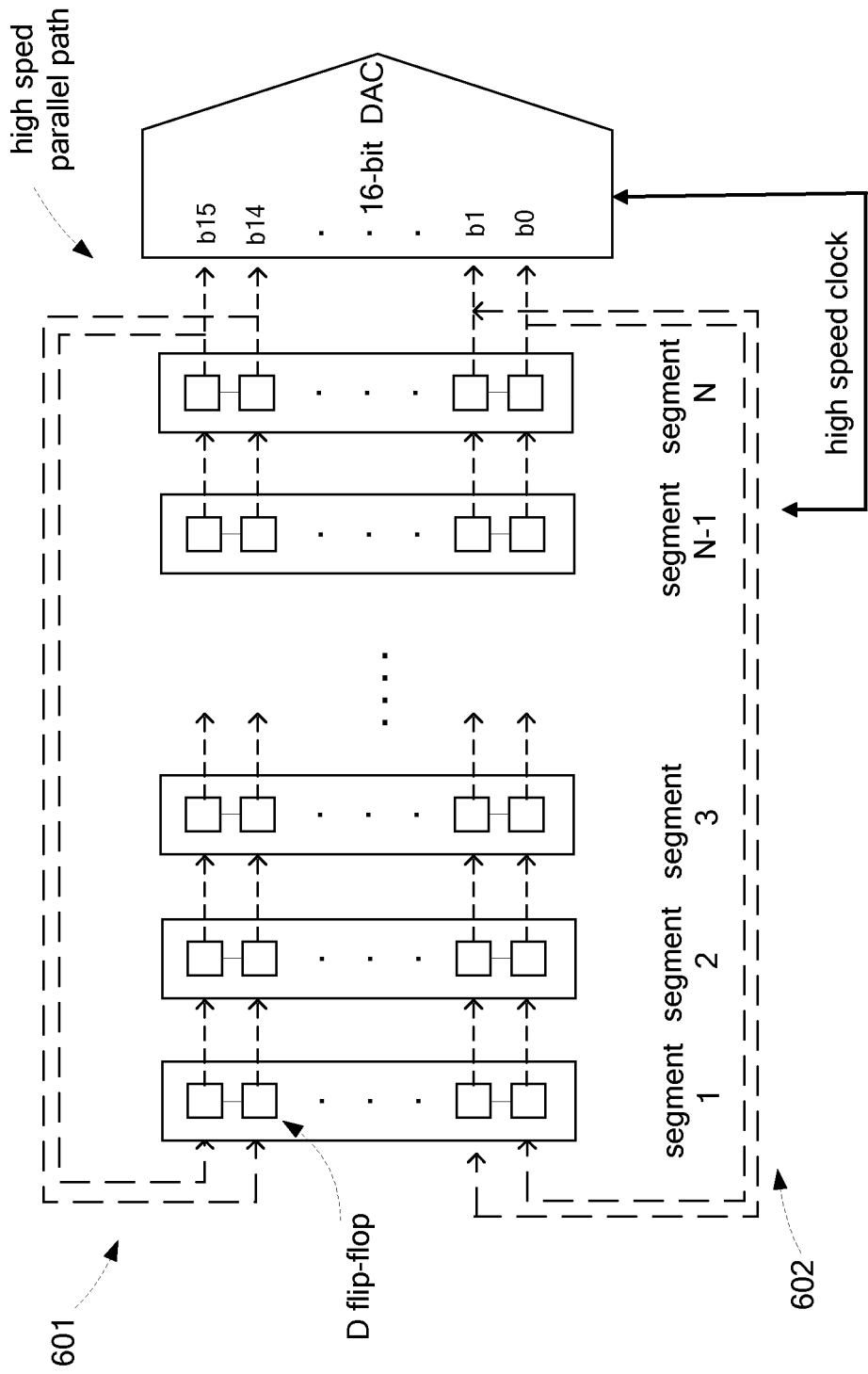
FIG. 6 illustrates the pattern generator signal path employed in pattern-read mode.

FIG. 6 illustrates the on-chip pattern generator employed in pattern-read mode. Once all the M×N flip flop are programmed during pattern write, next the pattern read mode is enabled to deliver written test pattern. During pattern-read mode, pattern generator is coupled to DAC and it delivers input test pattern to DAC. The pattern generator is sharing the same high-speed clock with DAC. The test pattern is transferred to DAC from one segment to the next segment. These N segments of pattern generator are executed in parallel at the same conversion rate of DAC. This parallel configuration enables full speed test for DAC's maximum conversion rate since the pattern generator is right next to DAC physically and the test pattern is already written in the pattern generator.

Figure 7:
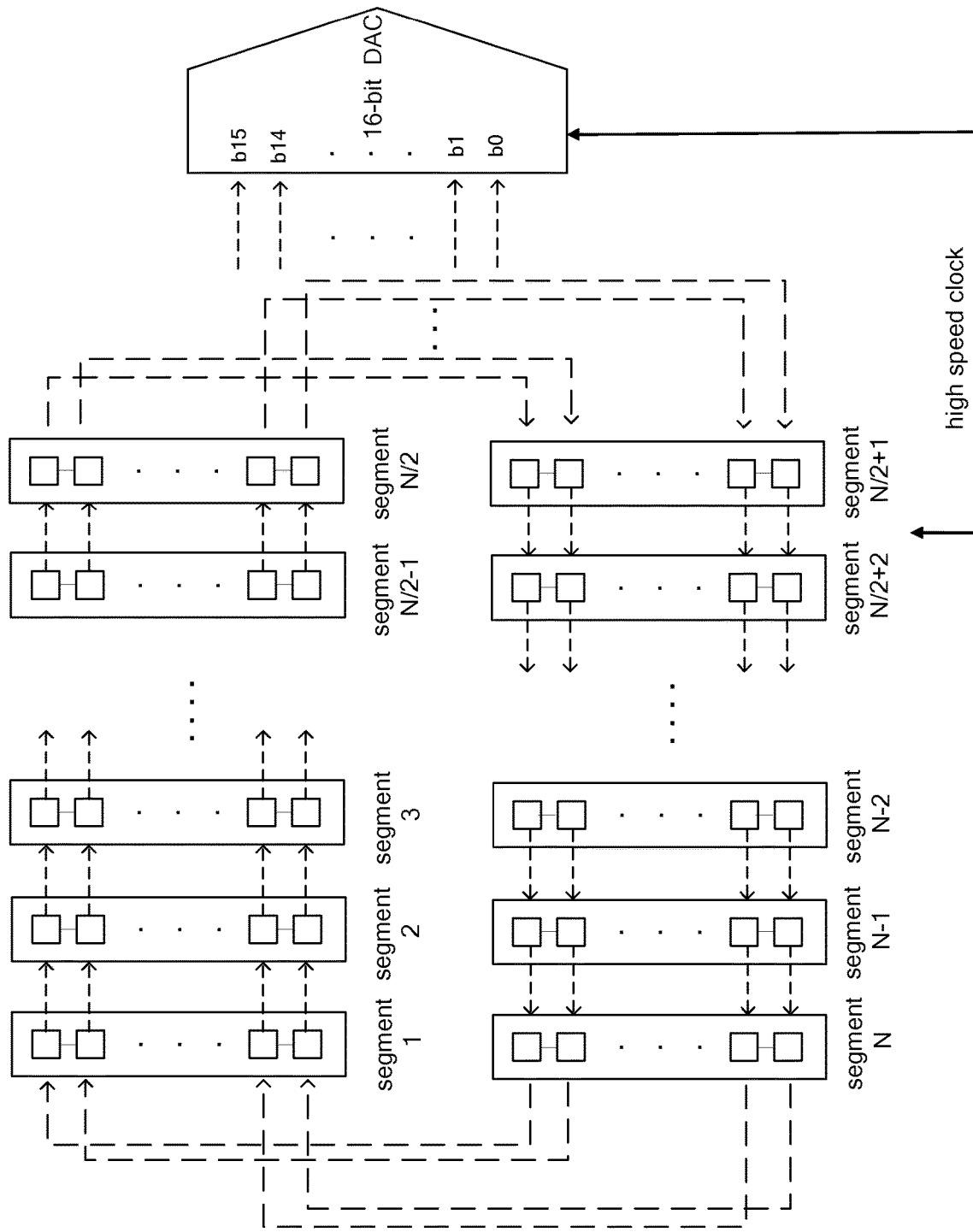
FIG. 7 illustrates the pattern generator implementation with two rows configuration.
Figure 8:
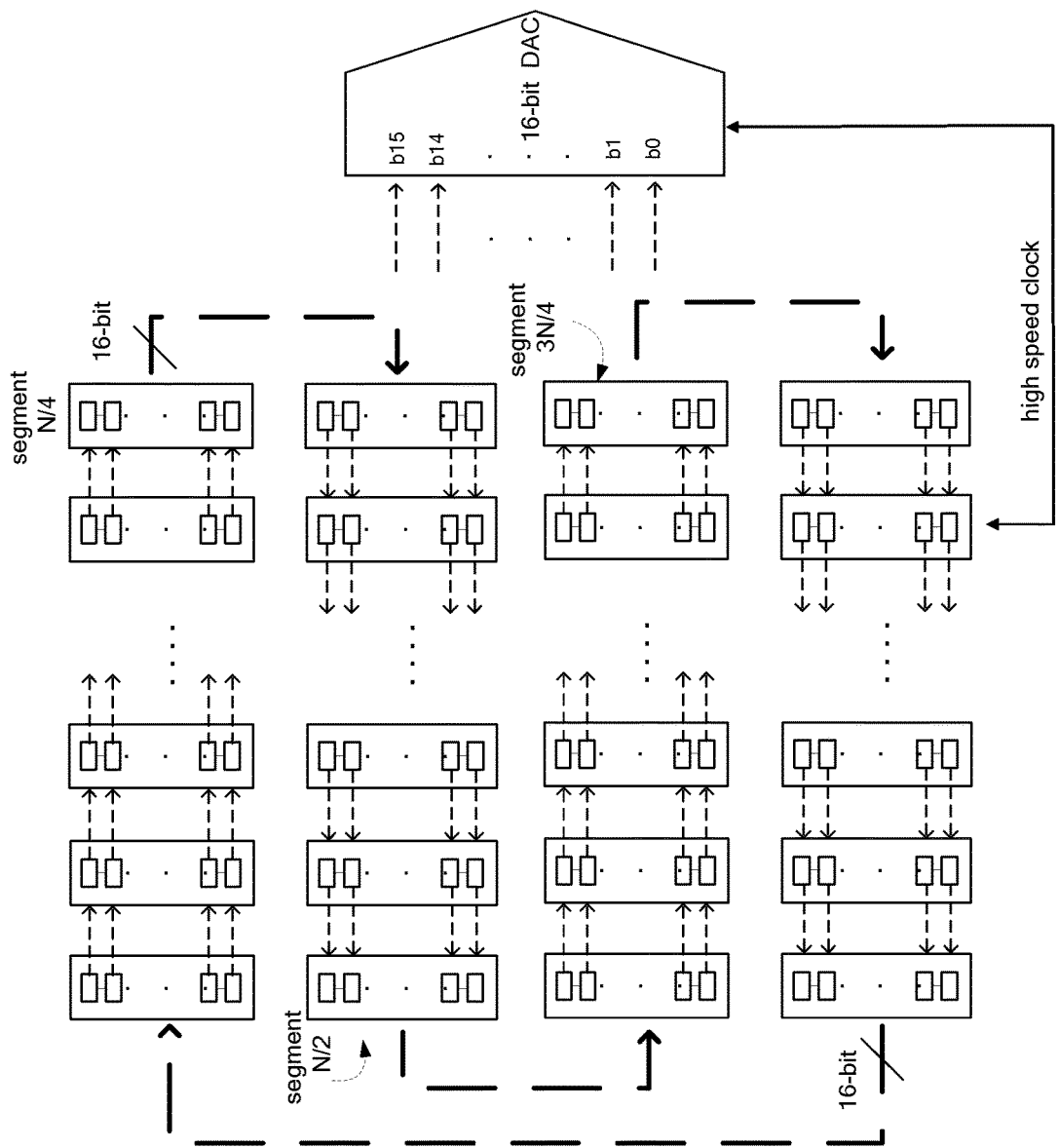
FIG. 8 shows the pattern generator implementation with four rows configuration.

The maximum transfer rate of on-chip pattern generator is limited by the longest routing 601 & 602 on FIG. 6 between the last segment and the first segment. Since the last segment N output is coupled back to the input of first segment 1, the parasitic capacitance of this long routing determines the maximum data rate the pattern generator can be transferred to DAC. To overcome this speed constraint, FIG. 7 illustrates another configuration implementation of on-chip pattern generator. The total N segments are separated equally into upper row and lower row. The upper row signal path and the lower row signal path are at the opposite direction to form and circular configuration. Owing to the number of segments is halved; the distance from the last segment to the first segment in each row is decreased by half. This configuration reduces the longest routing distance between segments by half and doubles the data transfer rate compared with the configuration on FIG. 6. Furthermore, for a very large N number, the total segments can be separated equally into four or eight rows as shown on FIG. 8. With the shorter routing distance, the data transfer rate is increased to 4 folds or 8 folds accordingly.

By incorporating an on-chip pattern generator, the maximum data rate of high-speed DAC testing is not limited by IC interface bottleneck any more. The on-chip pattern generator delivers test pattern at the full conversion rate of DAC and enables DAC characterization at its fullest extent of data rate. The test pattern is programmed and written into the pattern generator through existing SPI or I2C IC interface. This method does not add extra input/output pin of Integrated Circuit (IC) and does not require extra manufacture process. Besides, it minimizes the design complexity without employment of memory cell or memory compiler need.

What is claimed is:

1. An on-chip pattern generator, comprising:
    a digital to analog converter (DAC) on a substrate; and
    a series of D flip-flops on the substrate and implemented in predetermined serial and parallel configurations to deliver full speed test pattern for the DAC, wherein a chain of D flip-flops is coupled in series format and is also coupled in parallel format and each D flip-flop has two-to-one input multiplexer and the input multiplexer selects one of the two inputs for each D flip-flop.

2. The on-chip pattern generator of claim 1, wherein a chain of D flip-flops is coupled together in segments wherein each segment end is serially coupled to a next segment and each segment comprises M flip-flops, where M is the specified resolution of the DAC.

3. The on-chip pattern generator of claim 1, wherein a chain of D flip-flops is coupled in segments and one segment is coupled to the next segment in parallel format with an output of each segment being an input of the next segment and the last segment output is coupled back to the first segment input and forming a closed loop.

4. The on-chip pattern generator of claim 1, wherein the D flip-flops receives a pattern data comprises two operation modes: a pattern-write mode at low data rate and a pattern-read mode at high data rate, wherein the pattern-write mode is executed before the pattern-read mode is executed.

5. The on-chip pattern generator of claim 4, wherein the pattern-write mode is written serially through a serial data interface including SPI (Serial Peripheral Interface) or I2C (Inter-Integrated Circuit).

6. The on-chip pattern generator of claim 4, wherein the pattern generator is coupled to the DAC to deliver a test pattern during pattern-read mode, the test pattern being transferred from one segment to the next segment, where the pattern generator shares a DAC clock and transfers the test pattern at a conversion rate of the DAC.

7. The on-chip pattern generator of claim 1, wherein the segments are implemented as two or more rows to minimize a routing delay of parallel signal path and increase the data transfer rate.

8. The on-chip pattern generator of claim 1, wherein the segments are implemented as four or eight rows to minimize a routing delay between segments and increase the data transfer rate.

9. The on-chip pattern generator of claim 1, wherein a DAC test input pattern is generated either from an on-chip pattern generator or from external inputs controlled by an input multiplexer without adding extra input/output pin.

10. A method of enabling full speed test for a Digital-to-Analog Converter (DAC), comprising:
providing an on-chip pattern generator coupled to the DAC; and
sharing a clock with the on-chip pattern generator and the DAC and herein a chain of D flip-flops is coupled in series format and is also coupled in parallel format and each D flip-flop has two-to-one input multiplexer and the input multiplexer selects one of the two inputs for each D flip-flop.

11. A method of on-chip pattern generation, comprising providing an on-chip pattern generator having a chain of D flip-flops on a substrate; and
providing a digital to analog converter (DAC) on the substrate;
wherein the chain of D flip-flops are implemented in predetermined serial and parallel configurations to deliver full speed test pattern for a digital to analog converter (DAC).

12. The method of claim 11, wherein segments forming the chain of D flip-flops is coupled in series with one segment serially coupled to the next segment, and a segment length comprises a resolution of the DAC.

13. The method of claim 11, wherein the chain of D flip-flop is coupled with segments in parallel; one segment is coupled to the next segment in parallel format and the final segment output is coupled back to the first segment input forming a closed loop.

14. The method of claim 11, comprising configuring the chain of D flip-flop either in series format or in parallel format respectively, wherein an input multiplexer of the D flip-flops selects a serial signal path or a parallel signal path based on a selected configuration.

15. The method of claim 11, comprising providing a pattern generator with a pattern-write mode at low data rate and pattern-read mode at high data rate, further comprising executing the pattern-write mode before the pattern-read mode.

16. The method of claim 11, wherein the pattern generator is written serially through a serial interface of either an SPI (Serial Peripheral Interface) or an I2C (Inter-Integrated Circuit) interface during a pattern-write mode.

17. The method of claim 11, wherein a pattern generator is coupled to the DAC, comprising delivering test patterns to the DAC at a full conversion rate during a pattern-read mode and wherein a pattern generator clock is coupled to a DAC clock.

18. The method of claim 11, wherein the segment of pattern generator is formed as two rows in a circular configuration to minimize a routing distance between segments for high transfer rate.

19. The method of claim 11, wherein segments of pattern generator is formed as four or eight rows in a circular configuration to minimize a parasitic capacitance from routing between segments to achieve high transfer rate.

* * * * *